United States Patent [19]

Ruckert et al.

[11] Patent Number: 4,789,619

[45] Date of Patent: Dec. 6, 1988

[54] POSITIVE-WORKING RADIATION-SENSITIVE MIXTURE COMPRISING A SENSITIZING POLYMETHINE DYE

[75] Inventors: Hans Ruckert, Wiesbaden-Naurod; Joachim Knaul, Gehrden, both of Fed. Rep. of Germany

[73] Assignee: Hoechst Aktiengesellschaft, Fed. Rep. of Germany

[21] Appl. No.: 934,091

[22] Filed: Nov. 24, 1986

[30] Foreign Application Priority Data

Nov. 25, 1985 [DE] Fed. Rep. of Germany ....... 3541534

[51] Int. Cl.$^4$ .................. G03C 7/26; G03C 7/00; G03C 1/95

[52] U.S. Cl. ................................ 430/270; 430/142; 430/171; 430/193; 430/189; 430/176; 430/192; 430/926; 430/326; 430/292; 430/313

[58] Field of Search .............. 430/270, 142, 171, 193, 430/189, 176, 192, 926, 326, 292, 313

[56] References Cited

U.S. PATENT DOCUMENTS

| | | | |
|---|---|---|---|
| 3,100,703 | 8/1963 | Sprague et al. | 96/33 |
| 3,109,736 | 11/1963 | Sprague et al. | 96/90 |
| 3,554,752 | 1/1971 | Jackmann et al. | 96/90 |
| 3,563,749 | 2/1971 | Munder et al. | 96/90 |
| 4,063,948 | 12/1977 | Lind | 96/1.6 |
| 4,189,323 | 2/1980 | Buhr | 430/281 |
| 4,218,247 | 8/1980 | Hara et al. | 430/78 |
| 4,252,880 | 2/1981 | Lind et al. | 430/82 |
| 4,504,573 | 3/1985 | Ishikawa et al. | 430/288 |
| 4,506,003 | 3/1985 | Ruckert et al. | 430/270 |
| 4,506,006 | 3/1985 | Ruckert | 430/325 |
| 4,542,085 | 9/1985 | Takahashi et al. | 430/158 |
| 4,678,737 | 7/1987 | Schneller et al. | |

FOREIGN PATENT DOCUMENTS

| | | | |
|---|---|---|---|
| AU-A-51858 | 7/1984 | Australia. | |
| 0102745 | 3/1984 | European Pat. Off. . | |
| 0146411 | 6/1985 | European Pat. Off. | 430/270 |
| WO83/00752 | 3/1983 | PCT Int'l Appl. . | |
| 944126 | 12/1963 | United Kingdom . | |
| 1234648 | 6/1971 | United Kingdom . | |
| 1426277 | 2/1976 | United Kingdom . | |
| 2109573 | 9/1983 | United Kingdom . | |
| 2131190 | 6/1984 | United Kingdom . | |

*Primary Examiner*—Paul R. Michl
*Assistant Examiner*—Cynthia Hamilton
*Attorney, Agent, or Firm*—Foley & Lardner, Schwartz, Jeffery, Schwaab, Mack, Blumenthal & Evans

[57] ABSTRACT

A positive-working radiation-sensitive mixture is described that contains (a) a radiation-sensitive compound which forms a strong acid under the action of actinic radiation, (b) a compound with at least one C—O—C bond cleavable by acid, (c) a binder which is insoluble in water but soluble in aqueous-alkaline solutions, and (d) a polymethine dye. The polymethine dyes used are hemioxonol dyes or symmetrical cyanine dyes. In the light-sensitive mixture, these dyes effect high sensitization and high image sharpness contrast which, in addition, is substantially irreversible.

12 Claims, No Drawings

POSITIVE-WORKING RADIATION-SENSITIVE MIXTURE COMPRISING A SENSITIZING POLYMETHINE DYE

BACKGROUND OF THE INVENTION

The present invention relates to a radiation-sensitive mixture that is positive-working, i.e., the mixture becomes soluble as a result of irradiation; that contains, as the essential constituents, (a) a compound that forms a strong acid under irradiation, (b) a compound with at least one C—O—C bond cleavage by acid, (c) a binder which is insoluble in water and soluble in aqueous-alkaline solutions, and (d) a dye;

and that is suitable for the preparation of photoresists, electronic components and printing plates, as well as for chemical milling. Mixtures of this general description have been described, for example, in U.S. Pat. No. 3,779,778, No. 4,101,323 and No. 4,189,323, in German Offenlegungsschriften No. 2,718,254 and No. 2,928,636 and in European patent applications No. 0 006 626, 0 006 627 and 0 022 571. Further improvements and variants are the subjects of European patent application No. 0 042 562 and German Offenlegungsschrift No. 3,151,078.

When these materials are exposed, an acid is formed by photolysis of the compound (a), which acid effects cleavage of C—O—C groups of compound (b); as a result, the exposed areas of the light-sensitive layers become soluble in the developer. The light-sensitive mixtures can additionally contain soluble dyes or fine particles or dispersible dyes and, depending on the application, UV absorbers. Dyes which have proved suitable are the triphenylmethane dyes, particularly in the form of their carbinol bases, which show a marked image contrast not only after development, but even after exposure.

It is known that triarylmethane dyes generally are used in certain radiation-sensitive mixtures as sensitizers for the absorption range of 550–820 nm. An improvement in light sensitivity of particular radiation-sensitive mixtures, achieved by addition of their leuco or carbinol bases, is described in German Patentschriften No. 2,608,082 (corresponding to U.S. Pat. No. 4,218,247), No. 1,117,391 (corresponding to U.K. patent application No. 944,126) and No. 2,526,720 (corresponding to U.S. Pat. No. 4,063,948), in German Offenlegungsschriften No. 2,817,428 (corresponding to U.S. Pat. No. 4,252,880) and No. 3,240,935, and European patent application No. 0 102 745 for dyes that belong to the triarylmethane class but that can also be derived from substituted benzo[a]carbazoles.

In accordance with U.S. Pat. No. 3,109,736, the leuco bases of triphenylmethane or diphenylmethane dyes are added for sensitizing light-sensitive mixtures. It has been found, however, that such radiation-sensitive mixtures cannot be stored, since the leuco base is oxidized to the dye even in the dark, i.e., even the background becomes deeply colored.

The use of triphenylmethane dyes in the positive-working radiation-sensitive mixtures mentioned above, which in most cases will be termed "acid-cleavable systems" below, are described in European patent application No. 0 042 562 and in German Offenlegungsschrift No. 3,151,078. The drawbacks described in U.S. Pat. No. 3,109,736 also manifest themselves in these mixtures if triarylmethane dyes are used. Moreover, the requirement for durable image contrast after exposure is not always fulfilled. It has also been found that the color constancy is inadequate in liquid mixtures, i.e., in coating solutions and so-called liquid resists, in part depending on the nature and purity of the solvents used.

Apart from triarylmethane dyes, polymethine dyes, which are classified as photographic dyes and are technically used in the photographic industry, can generally also be used in light-sensitive mixtures. As additives in photographic silver halide emulsions and for the other light-sensitive substances, such as zinc oxide, titanium-(IV) oxide and organic photoconductors—which are sensitive only in the (ultra)violet range—these dyes must meet the following requirements:

When they are used as sensitizers, the dyes extend the spectral sensitivity of silver halide emulsions, which are sensitive only in the (ultra)violet range, into the visible, and sometimes the infrared spectral region.

When the dyes are used as antihalation dyes, they exert the function of filter dyes which are used for the absorption of undesired wavelengths, particularly in the UV region. This property simultaneously prevents the dispersion of light, caused by the photographic emulsion, and a resulting reduction in image sharpness.

The principle of adding photographic dyes of this type to positive- or negative-working reprographic mixtures is known for some radiation-sensitive mixtures. The objective in these instances is primarily the sensitization of the light-sensitive material, also in the visible spectral range. For these systems, which do not, however, correspond to the acid-cleavable systems described above, the sensitization ranges with respect to their wavelength are identical, or at least largely coincident with the absorption regions of the photographic dyes.

For cyanine dyes, this spectral region is generally in a range from 350–450 nm.

U.S. Pat. No. 3,106,466 discloses, for example, a copying material for the preparation of color-forming materials, photoresists and printing plates based on halogenated hydrocarbons, by means of which high image sharpness can admittedly be obtained after the addition of cyanine dyes; however, the mixtures show a relative insensitivity to light. It is stated that merocyanine dyes would be preferable in these cases.

A sensitizer which has the structural features of both cyanine dye and a merocyanine dye is described in PCT application No. 83/00,752, with an electrophotographic material as an example. The sensitizer is said to have good absorption in the visible region and a high stability of he exposed dye.

In German Patentschriften No. 1,283,093 and No. 1,286,898, trinuclear basic merocyanine dyes are used for sensitizing light-sensitive materials—which in this case, however, are color forming—based on halogenated hydrocarbons and N-vinyl compounds. These mixtures are said to have a high light sensitivity, intense color, high image sharpness and good stability.

European patent application No. 0 110 165 discloses a positive-working mixture for the preparation of a liquid resist, based on an alkali-soluble binder and an o-quinone-diazide, wherein the absorption region of the mixture can be shifted into a region below 350 nm, (that is, into the shorter wavelength region) by the use of polymethine dyes, the conjugated system of which is extended symmetrically by means of nitrones. These dyes also effect a high image sharpness contrast.

It is also known to obtain, by combination of several dyes, so-called panchromatically sensitized recording materials which allow sensitization across the entire spectral range. Such systems are described by referance to electrophotographic materials in German Offenlegungsschriften No. 2,817,428 and No. 2,353,639 and in European patent application No. 0 004 944.

In German Patentschrift No. 2,718,259 (corresponding to U.S. Pat. No. 4,189,323), light-sensitive mixtures are described that contain halogen-containing compounds which release acid under radiation, for example, trichloromethyl-triazine derivatives; a compound with at least one C—O—C bond which can be cleaved by acid; a binder; a ketone as solvent; and triarylmethane dyes, such as crystal violet, for effecting color changes. Examples 3 and 4 of this patent document show that it is also possible to use as the dye a styryl dye containing a benzo-fused heterocyclic ring or an nonsymmetrical cyanine dye. A sensitizing effect is not mentioned in this case.

Apart from the above-mentioned dyes, hemicyanines (German Offenlegungsschrift No. 3,410,387), oxadiazoles (European patent application No. 0 188 766) and hemioxonols or oxonols (European patent application No. 0 146 411 and German Offenlegungsschrift No. 3,319,991) can in principle also be used for sensitizing light-sensitive mixtures based on photopolymerizable compounds in the region 350–400 nm.

European patent application No. 0 146 411 describes positive- and negative-working light-sensitive mixtures that contain, in addition to an onium salt and a binder, a proton donor such as an o-quinone-diazide; but the disclosed class of proton donors also includes the leuco bases of dyes which are oxidized to the dye by the sensitized onium salt. It is even stated in this patent document that all onium salts are suitable in principle for absorption in the visible region or for sensitization, because protonation or a positive charge generally leads to a bathochromic color shift. In this regard, iodonium, sulfonium, bromonium, chloronium, phosphonium, sulfoxonium, oxysulfonium, selenonium, telluronium and arsonium salts, cyanine dyes with a positive charge due to quaternization and also anionic, (negatively charged) oxonol dyes, as well as neutral merocyanine dyes, are mentioned.

Such a generalization, heretofore conventional, which allows conclusions based on the absorption spectrum of a dye to be drawn with regard to the sensitization range of that dye, is put into question by German Offenlegungsschrift No. 3,319,991. The subject of this patent document is a negative-working light-sensitive mixture containing a diazo resin and, if appropriate, a binder, which mixture is to be sensitized in the region 350–450 nm by means of oxonol dyes. With these dyes, adequate adsorption of stray radiation, which allows improved image contrast even after relatively long irradiation, and higher image sharpness are achieved, in addition to high sensitization. By contrast, mixtures incorporating the dyes that are used in Comparison Example 1 of this patent document, such as benzeneazophenylamine, chrysoidine MC crystal and a hemioxonol dye, show a decrease in sensitivity, albeit with the same image sharpness, even though the dyes used ought to be suitable for sensitization on the bases of their absorption spectra.

The state of the art, as summarized above, therefore does not make it readily possible to predict whether a dye will be suitable as a sensitizer for specific light-sensitive mixtures.

SUMMARY OF THE INVENTION

It is therefore an object of the present invention to provide a positive-working, radiation-sensitive mixture which can be used to produce radiation-sensitive layers that display high, stable image contrast and suitable sensitization properties.

It is also an object of the present invention to provide a process for preparing photoresists and printing plates that employs a radiation-sensitive composition characterized by durable image contrast, permitting multiple exposure and developing steps.

In accomplishing the foregoing objects, there has been provided, in accordance with one aspect of the present invention, a positive-working radiation-sensitive mixture containing (a) a radiation-sensitive compound which forms a strong acid under the action of actinic radiation.

(b) a compound with at least one C—O—C bond cleavable by acid, (c) a binder which is insoluble in water but soluble in aqueous-alkaline solutions, and (d) a polymethine dye, wherein the polymethine dye is a hemioxonol dye or a symmetrical cyanine dye.

In accordance with another aspect of the present invention, a process has been provided for the preparation of photoresists and printing plates, which process comprises the steps of applying a radiation-sensitive mixture as described above to a support, then drying the mixture to form a layer on the support imagewise irradiating the layer with actinic radiation, developing the layer and modifying the support in the bared areas by etching or metal deposition. In a preferred embodiment, the process further comprises, after modification of the support, the steps of exposing the developed layer on the support under a further original, developing and again modifying the support thus bared.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

A mixture according to the present invention comprises a hemioxonol dye or a symmetrical cyanine dye as the polymethine dye. Such a mixture achieves a higher light sensitivity and a higher image contrast after exposure, the latter being substantially irreversible. The coloring of liquid resists, i.e., of coating solutions which are sometimes applied by customers only several months after the preparation to the substrate to be treated, also remains largely constant when such dyes are used. In contrast, color constancy of this sort is far from achieved in photoresist solutions based on acid-cleavage systems which are colored with triphenylmethane dyes.

By means of comparative experiments, it has been possible to show that not only the absorption spectrum of a selected dye but also the binder used affect the degree of sensitization. For example, a hemioxonol dye such as Acid Violet 520 PINA ® gives a somewhat weaker image contrast in an acidic polyacrylate resin than in a phenol/formaldehyde resin layer.

Thus, there is no apparent relationship, otherwise leading to a sensitivity increase in photosensitivity layers prepared according to the present invention, between absorption behavior in the color-providing, visible spectral region and in the light-sensitive region. It is assumed that the dyes of the present invention form more stable protonated intermediates, which in turn causes the higher stability of the image contrast, in the light-sensitive systems according to the present invention.

The dyes can be used individually or as mixtures, the total content of the dye or the mixture based on the total weight of non-volatile constituents of the light-sensitive mixture, being about 0.05 to 1.0% by weight. In preferred embodiments, the total content is 0.1 to 0.6% weight.

Those compounds represented by the general formula

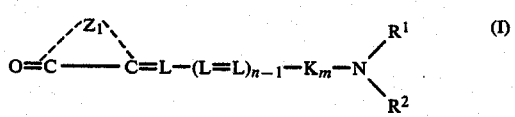

are preferred as the hemioxonol dyes used in the present invention.

(1) $R^1$ and $R^2$ in this formula can be either hydrogen atoms or alkyl groups, and a symmetrical substitution, e.g., $R^1 = R^2$, is preferred. If alkyl groups are selected, then it is preferred that short-chain, unbranched groups are used, preferably containing 1 to 3 carbon atoms.

(2) K is a carbon-conjugated ring system. This can be any aromatic system. Examples are benzene, cyclopentadiene, and mononuclear to trinuclear fused aromatic ring systems, such as naphthalene, and phenanthrene, and co-fused rings of benzene and cyclopentadiene, such as indene and fluorene. In preferred embodiments, aromatic systems are selected which carry a benzene ring as the base structure.

(3) m is 0 or 1, preferably 1.

(4) L is a methine group. It can be unsubstituted or substituted by short, usually unbranched alkyl groups, the substitution being especially in the meso-position, that is, at the central carbon atom of the polymethine chain.

(5) n is a positive number from 1 to 3, preferably 1 or 2.

(6) $Z_1$ represents non-metallic atoms that complete a five-membered or six-membered heterocyclic ring which can also be substituted.

Heterocyclic compounds with 5 or 6 rings can be used; most of these carry a nitrogen atom as a ring member in the position adjacent to the carbonyl group, so that a cyclic acid amide is formed as a structural feature common to all the ring systems. Five-ring heterocyclic compounds, as disclosed by L. Berlin and O. Riester, "Cyanines," in Houben-Weyl, V/ld METHODEN DER ORG. CHEMIE [Methods of Organic Chemistry] (4th ed 1972), which can be used in the present invention include:

Thiazolidinones, for example, 2,4-dioxo-tetrahydro-1,3-thiazoles and 4-oxo-2-thioxo-tetrahydro-1,3-thiazoles, in particular 3-(1-benzo-thiazolyl)-4-oxo-2-thioxo-tetrahydro-1,3-thiazole, the 3-alkyl or 3-aryl derivatives being included.

Thiazolinones, for example, 4-oxo-dihydro-1,3-thiazolines, including the 2-alkyl and 2-aryl derivatives, and also the 2-dialkylamino, 2-diarylamino or 2-alkylarylamino derivatives.

Oxazolidinones, for example, 2,4-dioxo-tetrahydro-1,3-oxazoles and 4-oxo-2-thioxo-tetrahydro-1,3-oxazoles, including the 3-alkyl and 3-aryl derivatives, and also 2-imino-4-oxo-tetrahydro-1,3-oxazoles, including the 2- and 3-aryl, -alkyl, -diaryl and -dialkyl derivatives.

Oxazolinones, for example, 4-oxo-dihydro-1,3-oxazolines including the 2-alkyl and 2-aryl derivatives.

Imidazolidinones, for example, 2,4-dioxo-tetrahydro-1,3-imidazoles and 4-oxo-2-thioxo-tetrahydro-1,3-imidazoles, including the 1- and 3-alkyl and -aryl derivatives, and also the 1,3-dialkyl, -diaryl and -arylalkyl derivatives.

Selenazolidinones, such as 2,4-dioxo-tetrahydro-1,3-selenazoles and 4-oxo-2-thioxo-tetrahydro-1,3-selenazoles, including the derivatives mentioned above for the thiazolidinones.

Pyrazolinones, such as 5-oxo-dihydro-pyrazoles, including the 1- and 3-alkyl, -aryl, and 1,3-dialkyl, -diaryl and -alkylaryl derivatives, which can also be substituted, for example, with carboxylic and sulfonic acid groups that can also be located on the nucleus.

Suitable 6-ring heterocyclic compounds include:

Pyrimidinones, for example, 2,4,6-trioxopyrimidine (barbituric acid) and 4,6-dioxo-2-thioxopyrimidine including the 1- and 3-alkyl, -aryl and 1,3-dialkyl, diaryl and -alkylaryl derivatives mentioned above for the pyrazolinones.

Piperazinones, such as 2,5-dioxo-piperazines and 5-oxo-2-thioxo-piperazines, including the 1- and 3-alkyl, -aryl and 1,3-dialkyl, -diaryl and -alkylaryl derivatives.

Those hemioxonol dyes are particularly preferred that carry a pyrazolinone ring as the heterocyclic compound. Among these dyes are the antihalo dyes of the PINA ® group from Riedel-de Haen AG, for example Acid Violet 520 PINA ® (article No. 28,587), Acid Violet 520 APINA ® (article No. 28,582), Acid Violet 520 NPINA ® (article No. 28,500), Acid Violet 520 TPINA ® (article No. 28,579), Acid Violet 596 PINA ® (article No. 28,513) and Acid Red 496 PINA ® (article No. 28,591).

Preparation methods for hemioxonol dyes are described in U.S. Pat. Nos. 2,089,729, 2,165,339, 2,186,608 and 2,216,441. R. C. Elderfield, in 5 THE CHEMISTRY OF HETEROCYCLIC COMPOUNDS 125–126 (John Wiley & Sons 1957), discloses the condensation reaction of pyrazolinone derivatives with (vinylogous) aldehydes, on which reaction the synthesis of hemioxonol dyes of formula I above is based.

Apart from hemioxonol dyes, symmetrical cyanine dyes represented by formula II below can also be employed, in accordance with the present invention, to accomplish the above-stated object:

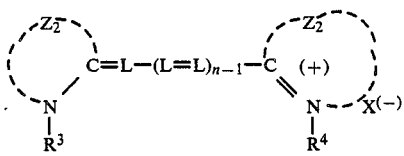

(II)

In this formula:

L is a methine group which is unsubstituted or substituted by an alkyl group, n is a positive integer from 1 to 4, $R^3$ and $R^4$ are each an alkyl radical, $Z_2$ represents the atoms required for completing a substituted or unsubstituted heterocyclic ring system and $X^{(-)}$ is an anion.

Quaternization (production of a positive charge) is achieved by reacting the bases with known alkylating agents. The anion $X^-$ as a monobasic acid radical is thus predetermined by the selection of alkylating reagent. Among other things, the choice of $X^-$ is of prime importance to the solubility of the dye. Thus, dye solubility decreases in the order of fluoride, chloride, methylsulfate, bromide, toluenesulfonate, thiocyanate, iodide, perchlorate, tetrafluoborate, picrate and phosphotungstate. In preferred embodiments, short-chain, unbranched alkyl bromides, in particular those having 1 to 4 carbon atoms, are chosen for the quaternization.

The linear, carbon-conjugated system $=L-(L=L)_{n-1}-$ preferably carries, if substituted, short-chain, unbranched alkyl groups, in particular in the meso-position. Short-chain alkyl groups are to be understood as those having about 1 to 4 carbon atoms; n preferably has a value of 1 to 3.

Suitable heterocyclic ring systems $Z_2$ include all heterocyclic systems that carry at least one nitrogen atom as a hetero atom. Corresponding to the particular heterocyclic system, the different types are: oxocarbocyanines, imidocarbocyanines, indocarbocyanines, thiocarbocyanines, selenocarbocyanines and quinocarbocyanines. Heterocyclic systems to be singled out in particular are: pyrroles, 1,3-oxazoles, benzo-1,3-oxazoles, 1,3-thiazoles, benzo-1,3-thiazoles, naphtho[1,2d]-1,3-thiazoles, naphtho[2,1d]-1,3-thiazoles, 1,3-selenazoles, benzo-1,3-selenazoles, naphtho[1,2d]-1,3-selenazoles, naphtho[2,1d]-1,3-selenazoles, 1,3-pyrazoles, 1,2-pyrazoles, indoles, benzoindoles, benzimidazoles, thiazines, oxazines, pyridines, pyrazines, pyridazines, pyrimidines, triazines, purines, quinolines, cinnolines, phthalazines, quinazolines, quinoxalines and pteridines.

Preferably, the following are used: quinolines, 1,3-thiazoles,, 1,3-selenazoles, benzo-1,3-thiazoles, benzo-1,3-selenazoles and the naphtho[1,2d]-1,3-thiazoles and naphtho[1,2d]-1,3-thiazoles. These also include the photographic dyes of the PINA ® group from Riedel-de Haen AG, Seelze, particularly the sensitizers S 935 PINA ® (article No. 28,246), KF 509 PINA ® (article No. 28,297) and KF 605 PINA ® (article No. 28,590).

These are numerous alternatives for synthesizing cyanine dyes. A clear summary of these is given by F. M. Hamer, "The Cyanine Dyes and Related Compounds," in THE CHEMISTRY OF HETEROCYCLIC COMPOUNDS (John Wiley & Sons 1964).

As mentioned above, the mixtures of the present invention also contain a radiation-sensitive or light-sensitive combination of compounds.

The components that form or release strong acids on irradiation include a large number of known compounds and mixtures, such as diazonium, phosphonium, sulfonium and iodonium salts, halogen compounds, o-quinone-diazidesulfochlorides and organo-metal/organo-halogen combinations. The diazonium, phosphonium, sulfonium and iodonium compounds are generally used in the form of their salts which are soluble in organic solvents, in most cases as precipitation products with complex acids such as tetrafluoroboric acid, hexafluorophosphoric, hexafluoroantimonic and hexafluoroarsenic acid.

In principle, all the organic halogen compounds known as photochemical free radical initiators, for example, those having more than one halogen atom on one carbon atom or on one aromatic ring, can also be used as halogen-containing compounds that are radiation-sensitive and form hydrohalic acid. Examples of these are disclosed in U.S. Pat. Nos. 3,515,522, 3,536,489 and 3,779,778, in German Patentschrift No. 2,610,842 and in German Offenlegungsschriften Nos. 2,243,621, 2,718,259 and 3,337,024. Among these compounds, the s-triazine derivatives with two halogenomethyl groups, in particular trichloromethyl groups, and an aromatic or unsaturated substituent on the triazine nucleus, such as are described in German Offenlegungsschriften Nos. 2,718,259 and 3,337,024, are preferred.

Examples of suitable initiators are: 4-(di-n-propylamino)-benzenediazonium tetrafluoborate, 4-p-tolylmercapto-2,5-diethoxy-benzenediazonium hexafluorophosphate and tetrafluoborate, diphenylamine-4-diazonium sulfate, 4-methyl-6-trichloromethyl-2-pyrone, 4-(3,4,5-trimethoxystyryl)-6-trichloromethyl-2-pyrone, 4-(4-methoxystyryl)-6-(3,3,3-trichloropropenyl)-2-pyrone, 2-trichloromethyl-benzimidazole, 2-tribromomethylquinoline, 2,4-dimethyl-1-tribromoacetylbenzene, 3-nitro-1-tribromoacetylbenzene, 4-dibromoacetylbenzoic acid, 1,4-bis-dibromomethylbenzene, tris-dibromomethyl-s-triazine, 2-(6-methoxy-naphth-2-yl)-, 2-(naphth-1-yl)-, 2-(naphth-2-yl)-, 2-(4-ethoxy-ethylnaphth-1-yl)-, 2-(benzopyran-3-yl)-, 2-(4-methoxy-anthrac-1-yl)-, 2-(4-styrylphenyl)- and 2-(phenanthr-9yl)-4,6-bistrichloromethyl-s-triazine, as well as the compounds listed in the examples below.

The quantity of the initiator used can differ widely, depending on the chemical nature of the initiator and the composition of the mixture. Advantageous results are obtained with about 0.1 to 10% by weight, based on total solids, 0.2 to 5% being preferred. Particularly for copying layers of more than 10 μm thickness, it is advisable to use relatively little acid donor.

As the compounds that are cleavable by acid, those that are preferred carry at least one orthocarboxylic acid ester and/or carboxylic acid amide/acetal grouping. These compounds can also have a polymeric character, and the groupings mentioned can appear as linking elements in the main chain or as side substituents. In addition, oligomer and polymer compounds with recurring acetal and/or ketal groupings in the main chain, and compounds having at least one enol ether or N-acyl-iminocarbonate grouping, can be used.

Such acid-cleavable compounds are disclosed in U.S. Pat. Nos. 3,779,778 and 4,101,323, in German Patentschriften Nos. 2,718,254 and 2,306,248 in German Offenlegungsschriften Nos. 2,829,512, and 2,829,511, and in European patent applications Nos. 0 022 571, 0 006 626 and 0 006 627. Of the orthocarboxylic acid derivatives disclosed by U.S. Pat. No. 4,101,323, the bis-1,3-dioxan- 2-yl ethers of aliphatic diols are preferred. Of the polyacetals disclosed by German Offenlegungsschrift No. 2,718,254, those with aliphatic aldehyde and diol units are preferred.

Further highly suitable mixtures are described in German Offenlegungsschrift No. 2,928,636. In this patent document, polymeric ortho-esters with recurring ortho-ester groups in the main chain are disclosed as acid-cleavable compounds. These groups are 2-alkyl ethers of 1,3-dioxa-cycloalkanes with 5 or 6 ring members. Polymers with recurring 1,3-dioxacyclohex-2-yl alkyl ether units, in which the alkyl ether group can be interrupted by ether oxygen atoms and is preferably bonded to the 5-position of the adjoining ring, are particularly preferred.

The quantity of the acid-cleavable compounds present in the light-sensitive mixture is in general between 5 and 65% by weight, preferably between 6 and 30% by weight, based on the non-volatile constituents of the mixture.

In addition to the light-sensitive constituents described above, the coating solutions can contain polymeric binders. Those polymers are preferred that are water-insoluble and are soluble or swellable in aqueous-alkaline solutions.

Natural resins such as shellac and colophony, and synthetic resins such as copolymers of styrene and maleic anhydride and copolymers of acrylic acid or methacrylic acid, particularly with acrylates or methacrylates, and especially novolaks are mentioned as alkali-soluble binders or binders which are swellable in alkali. As novolak condensation resins, the more highly condensed resins with substituted phenols as the formaldehyde condensation partners have proved to be particularly suitable. The nature and quantity of the alkali-soluble resins can vary depending on the application; contents between 30 and 90% by weight, preferably 55–85% by weight, of total solids are preferred. Polymers of the type of poly-(alkenylphenol) or of (meth)acrylates of polyhydric phenols can also be used to advantage in place of, or as a mixture with, novolaks. Moreover, numerous other resins can be used additively, preferably vinyl polymers such as polyvinyl acetates, polyacrylates, polyvinyl ethers and polyvinylpyrrolidones, which in turn can have been modified by comonomers. The most advantageous proportion of these resins depends on the application requirements and the effect on the development conditions, and it is in general not more than 20% of the alkali-soluble resin. For special requirements such as flexibility, adhesion, gloss and the like, the light-sensitive mixture can also contain small quantities of substances such as polyglycols, cellulose derivatives, such as ethylcellulose, and wetting agents.

The photoresist solution can be applied in the conventional manner to the support which is to be coated, for example, by dipping, by casting, by whirling, by spraying, by means of rollers or by means of slot dies.

Suitable supports which can be coated with solutions according to the present invention are all the materials conventionally used in photoresist technology, such as copper-laminated plates of insulating material, copper cylinders for gravure, nickel cylinders for screen printing, aluminum plates, glass plates and also the silicon, silicon nitride and silica surfaces usual in micro-electronics.

Letterpress printing and offset printing plates can also be prepared by applying the coating solutions according to the invention, for example to plates of zinc, brass/chromium, aluminum/copper/chromium, aluminum or steel.

The preferred supports for thick layers, i.e., layers that are over 10 $\mu$m in thickness are plastic films which then serve as temporary supports for transfer layers. Polyester films, for example, of polyethylene teraphthalate, are preferred for this purpose and for color foils. However, polyolefin films such as polypropylene are also suitable. Metals are used in most cases as the layer supports when layer thicknesses are below about 10 $\mu$m. The following can be used for offset printing plates: mechanically or chemically roughened and, if appropriate, anodized aluminum which, in addition, can have been chemically pretreated, for example, with polyvinylphosphonic acid, silicates or phosphates.

Finally, the coating can be effected directly or by layer transfer from the temporary layer support to printed circuit board materials, which consist of insulating plates with a copper deposit on one side or both sides; to glass or ceramic materials which optionally have been subjected to an adhesionpromoting pretreatment, and to silicon wafers. In addition, surfaces of wood, textiles and many other materials can be coated that are advantageously provided with images by projection and are resistant to the action of alkaline developers.

Examples of the solvents used are ethylene glycol monomethyl ether, ethylene glycol monoethyl ether, aliphatic esters such as butyl acetate, aliphatic ketones such as methyl isobutyl ketone and acetone, dioxane, xylene and halogenated aromatic compounds such as chlorinated xylene, benzene and toluene.

The main constituents of industrial photoresist solutions are in general ethylene glycol derivatives like the monomethyl and monoethyl ethers, the corresponding ethers of diethylene glycol, and ethylene glycol ethyl ether-acetate. However, mono-$C_1$–$C_4$-alkyl ethers of 1,2-propanediol can also be used. The alkyl ether group can be in the 1-position or 2-position of the propanediol; in the case of the monomethyl ether, the more readily available 1-methoxypropan-2-ol is generally preferred. Mixtures of the two methyl isomers and/or mixtures of the mono-$C_1$–$C_4$-alkyl ethers of propanediol can also be used.

The commercially available propanediol ethers mentioned above have the advantage that in many cases they give coating solutions that provide more uniform flow and more uniform layers. The advantages in the behavior of the solution are retained when a part of the propanediol monoalkyl ether is replaced by other conventionally added solvents, for example, esters such as butyl acetate; hydrocarbons like xylene; ketones, for example, acetone or butanone; and alcohols and certain alkoxyalkyl esters, such as 3-methoxybutyl acetate. It is possible in this way, if desired, to modify the wetting, flow and evaporation behavior of the solution in an individual case. The quantity of such additional solvents present should below 50% by weight in every case. Preferably, the proportion is 0—35% by weight, in particular 0–20% by weight, based on the solvent mixture. Accordingly, the solvent or solvent mixture according to the present invention can comprise 65 to 100% of a 1,2-propanediol mono-$C_1$–$C_4$-alkyl ether, preferably a 1,2-propanediol mono-methyl and/or -ethyl ether. It is also possible, for example, to increase the flexibility of the layer by the addition of higher-boiling alcohols or ethers, a small quantity (for example, 1-2%) of which remains in the layer on drying. The evaporation rate can likewise be increased, if desired, by the addition of a lower-boiling solvent, for example sec-butanol.

Conventional apparatus and conditions can be applied for drying after coating, and temperatures around 100° C., and briefly up to 120° C., are tolerated without a loss in radiation sensitivity.

For exposure, the conventional light sources, such as fluorescent tubes, pulsed xenon lamps, metal halide-doped high-pressure mercury vapor lamps and carbon arc lamps, can be used. "Irradiation" is to be understood in this context as denoting the action of actinic electromagnetic radiation in the wavelength region below about 500 nm. All radiation sources emitting in this wavelength region are suitable in principle.

Laser irradiation apparatus, particularly automatic processing units which contain, for example, an argon ion laser as the radiation source, are used to advantage in accordance with the present invention. Irradiation with electron beams is also possible. In this case, acid-forming compounds which are not light sensitive in the usual sense, such as halogenated aromatic compounds or halogenated polymeric hydrocarbons, can also be used as the initiators of the solubilization reaction. X-rays can also be used for generating images.

The imagewise exposed or irradiated layer can be removed in a known manner, using virtually the same developers as are used for commercially available naphthoquinone-diazide layers and resists. Alternatively, the copying behavior of the new materials can be matched advantageously to known auxiliaries, such as developers and programmed spray-development units. The aqueous developer solutions can contain, for example, alkali metal phosphates, silicates or hydroxides, wetting agents and, if appropriate, minor proportions of organic solvents. In certain cases, solvent-water mixtures are also useful as developers. The choice of the most advantageous developer can be determined by experiments with the particular layer used. If required, the development can be mechanically assisted.

When they are used as printing plates, the developed plates can be briefly heated to elevated temperatures, in the manner known from British patent application No. 1,154,749 for diazo layers, in order to improve the durability on printing and the resistance to washout solutions, correcting agents and printing inks hardenable by UV light.

The examples which follow illustrate preferred embodiments of the present invention. In the examples, parts by weight (p.b.w) and parts by volume (p.b.v) are related as g:cm$^3$; unless otherwise stated, reported percentages and quantitative proportions are to be understood as fractions by weight.

EXAMPLE 1

A coating solution comprising
- 7 p.b.w. of a cresol/formaldehyde novolak having a softening range of 105–120' C according to DIN 53,181,
- 2 p.b.w. of 2-(naphth-2-yloxy)-5,5-dimethyl-1,3-oxazolin-4-one,
- 0.4 p.b.w. of 2-(4-methoxy-anthrac-1-yl)-4,6-bis-trichloromethyl-s-triazine, and
- 0.05 p.b.w. of Acid Violet 596 PINA ® (article No. 28,513; Riedel-de Haen AG) in
- 90.6 p.b.w. of 1-methoxy-propan-2-ol was applied to aluminum, wire-brushed on one side, by roller coater. A dry layer weight of about 2 g/m$^2$ was obtained. The blue-violet or green-bluish layer was exposed in each case under a positive original including a continuous tone step wedge; was developed with a 3.5% aqueous solution of trisodium phosphate adjusted to pH 12.6 by addition of sodium hydroxide, and then was rinsed with water before finally being made ready for printing by wiping with 1% phosphoric acid.

For comparison, a printing plate was prepared in the same way as described above, but with the dye Acid Violet 596 replaced by the same quantity of crystal violet base.

The layer dyed with the dye according to the present invention had a light sensitivity that was about 2 steps (=factor 2) higher than that of the layer dyed with crystal violet base. In the exposed areas, both layers were paler yellowish or bluish. When exposed lots were left for two weeks, the image contrast in the case of the triphenylmethane dye and vanished—noticeably even after 1 day—but was preserved almost unchanged in the case of the hemioxonol dye.

EXAMPLE 2

A solution comprising
- 15 p.b.w. of butanone,
- 45 p.b.w. of 1-methoxy-propan-2-ol,
- 28 p.b.w. of the novolak in Example 1,
- 3.5 p.b.w. of polyvinyl ethyl ether (Lutonal A 25, BASF),
- 8.5 p.b.w. of the polyacetal from 2-ethylbutyraldehyde and triethylene glycol,
- 0.2 p.b.w. of 2-(6-methoxy-naphth-2-yl)-4,6-bis-trichloromethyl-s-triazine, and
- 0.2 p.b.w. of Acid Violet 520 PINA ®, an antihalo dye from Riedel-de Haen (article No. 28,587), was prepared for producing a nickel rotary cylinder for textile screen printing by electroplating. A layer about 25–30 μm thick of good surface quality was applied by spray-coating, using compressed air, to a bright, slightly contractable nickel cylinder provided with a conductive release coat. The cylinder, rotating for this purpose, was then dried sufficiently for about 20 minutes under IR radiant heaters.

The red-violet layer thus obtained was then sufficiently exposed under a screeded positive (with 32 screen elements per cm) of the motif to be printed, resulting in almost complete decolorization to pale yellow, to yield a contrast-rich image. This was developed with a solution containing
- 0.5% of NaOH,
- 0.8% of sodium metasilicate×9H$_2$O, and
- 1.0% of ethylene glycol mono-n-butyl ether in
- 97.7% of deionized water.

For this purpose, the rotating exposed cylinder was dipped into a trough half-filled with the developer. The trough was brought away after 4 minutes' rotation of the cylinder in the developer, and the cylinder was then rinsed with water and dried in air.

Nickel was deposited electrolytically up to a thickness of 0.1 mm onto the bared areas of the cylinder core. After contraction of the cylinder core, detachment of the resist stencil with acetone and drawing it off the core, an elastic rotary stencil printing form was obtained. Ink was transferred imagewise through the holes of the rotary stencil to the materials to be printed.

By means of the dye used, a layer was obtained that was richer in contrast both for exposure and for development and, if necessary, retouching, than was hitherto possible with the dyes used for this purpose. Similar results were obtained when Acid Violet 520 T PINA ® (article No. 28,579) was used in place of Acid Violet 520 PINA ®.

EXAMPLE 3

A coating solution comprising
76 p.b.w. of 1-methoxy-propan-2-ol,
13.6 p.b.w. of novolak,
6.6 p.b.w. of 1,3-bis-[2-(5-ethyl-5-butyl-1,3-dioxa-cyclohexoxy)]-2-ethyl-2-butyl-propane,
1.1 p.b.w. of 2-acenaphth-5-yl-4,6-bistrichloro-methyl-s-triazine and
0.1 p.b.w. of the polymethine dye sensitizer S 935 PINA ® (article No. 28,246)

was used, by whirler-coating at 6000 rpm and final drying in a circulating-air oven, to provide a silicon wafer with a dyed storable positive layer of high light sensitivity. On exposure, a marked image contrast from violet to light red was produced, such as is not obtained with the commercially available photoresists widely used in microelectronics, such as AZ 1350 J, which is based on o-guinone-diazides.

EXAMPLE 4

The suitability of the dyes described above in layers sensitive to electron beams is demonstrated below. A photoresist solution was prepared from
55 p.b.w. a copolymer of 4-hydroxy-styrene and hexyl methacrylate (OH number 290; RSV value 0.55 dl/g in dimethylformamide),
15 p.b.w. of the polyacetal from diethylene glycol divinyl ether and cyclohexane-1,4-diol,
0.5 p.b.w. of 2-(4-ethoxy-naphth-1-yl)-4,6-bis-trichloromethyl-s-triazine,
0.2 p.b.w. of Acid Red 496 PINA ® (article No. 28,591),
0.2 p.b.w. of CI Solvent Blue 35 (CI 61,554), and
170 p.b.w. of ethanol.

This solution was used for coating a glass plate, coated with indium tin oxide (ITO), for the preparation of liquid crystal display elements (LC displays), in a thickness of about 12 μm (about 15 g/m²) by whirler-coating at 125 rpm. The light-blue layer was irradiated with 11 kV electrons in such a way that the color almost completely vanished in these areas, and only the later conductor tracks were readily visible. This contrast-rich image was obtained after about 40 seconds for 10 cm² at a beam current of 5 μA; it was developed with a buffered aqueous-alkaline developer of pH 13.2, which contained a wetting agent. After etching of the ITO in the bared areas with 5% hydrochloric acid and stripping of the resist, the plate was ready, for example, for a 7-digit numerical display. The image contrast was intensified by background dyeing with Solvent Blue 35.

EXAMPLE 5

For the preparation of fine-line boards by roller coater, the following layer constituents were dissolved in 1-methoxy-2-propan-2-ol to give a solution of 30% solids content:
64 p.b.w. of novolak,
10.5 p.b.w. of polyvinyl methyl ether (Lutonal M 40),
15 p.b.w. of polyacetal obtained from 2-ethylbutyraldehyde and hexane-1,6-diol,
9.8 p.b.w. of the poly-ortho-ester obtained from trimethoxymethane and 5-oxa-7,7-di-hydroxymethyl-nonan-1-ol,
0.4 p.b.w. of 2-[4-(2-ethoxyethoxy)-naphth-1-yl]-4,6-bis-trichloromethyl-s-triazine, and
0.3 p.b.w. of Acid Violet 520 A PINA ® (article No. 28,582).

A coating solution was obtained that had a viscosity of about 90 mm²/s, which was suitable for roller-coating, for example, with the roller applicator AKL 400 from Buerkle, Freudenstadt. With the use of serrated rubber rollers having 48 serrations per 2.5 cm (linear), dry layer thicknesses of up to about 10 μm could be obtained by single application to both sides of through-plated copper-laminated insulating material plates, without filling the holes.

After drying, the plate was first exposed under a negative original corresponding to the hole areas, and these areas were then washed out with the developer described in Example 2. The plate was dried for 10 minutes at 80° C., then reinforced in the bared hole areas by electroplating with copper, whereupon lead/-tin was electrically deposited. This photoresist layer was then exposed under a positive conductor track original and developed as above. The bared copper is etched away with an alkaline etch, fine conductor lines of about 70 μm copper track width being formed.

By means of the dye used in place of the crystal violet base, an image that was very rich in contrast to both the unexposed parts and to the electroplated areas, coupled with comparatively high light sensitivity, was produced not only in the first exposure step, but also in the second exposure, even after electroplating. Due to the high image contrast, register errors which may be present in this fine-line circuit and necessary retouching work can be readily controlled and dealt with. Similar results were obtained when the sensitizer KF 605 (article No. 28,590) was used in place of Acid Violet 520 A, the image contrast ranging from green to light.

EXAMPLE 6

A coating solution comprising
8.0 p.b.w. of a copolymer of 4-isopropenylphenol and methyl methacrylate (OH value 310; RSV value 0.189 dl/g in dimethylformamide),
0.8 p.b.w. of a polymeric ortho-ester prepared by condensation of trimethyl orthoformate with 4-oxa-6,6-bishydroxymethyl-octan-1-ol,
0.03 p.b.w. of 2-(4-styrylphenyl)-4,6-bistrichloromethyl-s-triazine,
0.01 p.b.w. of Acid Violet 520 N PINA ® (article No. 28,500) and for basic dyeing
0.01 p.b.w. of the sensitizer KF 509 PINA ® (article No. 28,297, in
180 p.b.w. of methyl ethyl ketone
was applied to an aluminum carrier roughened by metal wire brushes and was dried. The light-sensitive plate obtained had a layer weight of about 1.5 g/m². It was exposed for 5 seconds with a positive original under a 5 kW metal halide lamp at a distance of 140 cm, and was developed for about 30 seconds with a solution containing:
0.6% of NaOH,
0.5% of sodium metasilicate 5H₂O, and
1.0% of n-butanol in
97.9% of deionized water.

The nonirradiated areas could be inked with oily ink for printing in an offset printing press. This highly light-sensitive positive offset plate displayed excellent image contrast both after exposure and during development and, due to this coloring, facilitated processing control.

EXAMPLE 7

For producing a positive dry resist for etching and electroplating applications, the following solution was prepared:

57 p.b.w. of methyl ethyl ketone, 30 p.b.w. of novolak as in Example 1, 7.5 p.b.w. of the bis-(5-ethyl-5-methoxymethyl-1,3-dioxan-2-yl) ether of 2-ethyl-2-methoxymethyl-1,3-propanediol, 5.0 p.b.w. of 1,3-propanediol bis-(3,4-dihydronaphth-2-yl) ether, 0.3 p.b.w. of the triazine described in Example 5, and 0.2 p.b.w. of Acid Violet 520 PINA ® (article No. 28,579).

A 25 μm thick, biaxially stretched and thermoset polyethylene terephthalate film which had been pretreated with trichloroacetic acid/polyvinyl alcohol was coated with this solution, dried and laminated with a 12 μm thick polyethylene film in such a way that a resist layer of a uniform thickness of 15 μm was produced between the two films.

In a commercially available laminator, bright brass plates for the manufacture of contact springs for switches were, after peeling off the backing film, laminated on both sides with this layer under the action of pressure and heat. After cooling, peeling off of the carrier film, and brief further drying in a drying cabinet (80′ C), the coated plate was exposed on both sides with a pair of congruent originals in the form of a pocket, the image color changing from violet-red to pale yellow. This was followed by spray development on both sides with the developer used in Example 2, and by rinsing thereafter. The contrast-rich plates thus obtained were etched with commercially available ferric chloride solution by the chemical milling process until they were etched through to smooth flanks.

The chemically milled parts produced in this manner were as a group exposed a second time, before separation, with the appropriate original to effect baring and gold-plating of the contact ends. The resist layer again showed a contrast rich image; it was developed and finally provided with a thin gold-plating by electrodeposition in the bared areas. Only after final inspection, which was easy because of the good contrast even between the gold layer and the remaining red resist layer on brass, were these switch parts stripped from the resist, bent into the correct form and installed.

What is claimed is:

1. A positive-working radiation-sensitive mixture containing,
   (a) a radiation-sensitive compound which forms a strong acid under the action of actinic radiation,
   (b) a compound with at least one C—O—C bond cleavable by acid,
   (c) a binder which is insoluble in water but soluble in aqueous-alkaline solutions, and
   (d) a sensitizing polymethine dye, wherein said polymethine dye is a hemioxonol dye or a symmetrical cyanine dye.

2. A radiation-sensitive mixture as claimed in claim 1, wherein said polymethine dye is a hemioxonol dye represented by the formula:

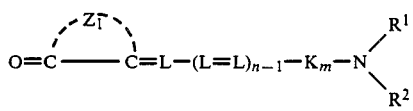

in which
L is a methine group which is unsubstituted or substituted by an alkyl group,
K is a carbon-conjugated ring system,
n is a positive number from 1 to 3,
m is 0 or 1,
$R^1$ and
$R^2$ are identical or different, and each represents a hydrogen atom or an alkyl radical, and
$Z_1$ represents non-metallic atoms which complete a five-membered or six-membered, substituted or unsubstituted heterocyclic ring.

3. A radiation-sensitive mixture as claimed in claim 1, wherein said polymethine dye is a symmetrical cyanine dye represented by the formula

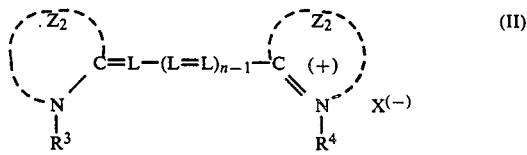

in which
l is a methine group which is unsubstituted or substituted by an alkyl group,
n is a positive integer from 1 to 4,
$R^3$ and
$R^4$ represent an alkyl radical,
$Z_2$ represents the atoms required for completing a substituted or unsubstituted heterocyclic ring system, and
$X^{(-)}$ is an anion.

4. A radiation-sensitive mixture as claimed in claim 2, wherein the linear carbon-conjugated system of said hemioxonol dye is either substituted in the meso-position by an alkyl group or further comprises a carbocyclic ring, and $Z_1$ is a pyrazolinone ring.

5. A radiation-sensitive mixture as claimed in claim 3, wherein (a) $R^3$ and $R^4$ are identical and represent ethyl groups, (b) each $Z_2$ represents at least two fused rings and (c) $X^{(-)}$ is a bromide ion.

6. A radiation-sensitive mixture as claimed in claim 1, wherein said polymethine dye is present in said radiation-sensitive mixture in an amount ranging from about 0.05 to about 1.0% by weight.

7. A radiation-sensitive mixture as claimed in claim 1, wherein said binder is a novolak, a polyvinylphenol or a copolymer of acrylic or methacrylic acid and an acrylate or methacrylate.

8. A radiation-sensitive mixture as claimed in claim 1, wherein said compound (a) is a trihalogenomethyl-s-triazine.

9. A radiation-sensitive mixture as claimed in claim 1, wherein said compound (b) is an orthocarboxylic acid derivative or an acetal.

10. A process for the preparation of photoresists and printing plates, comprising the steps of applying a radiation-sensitive mixture as claimed in claim 1 to a support; drying said mixture to form a layer on said support; imagewise irradiating said layer with actinic radiation;

developing said layer and modifying said support in the bared areas by etching or metal deposition.

11. The process as claimed in claim 10, further comprising, after modification of said support, the steps of exposing the developed layer on said support under a further original, developing and again modifying the support thus bared.

12. A radiation-sensitive mixture as claimed in claim 1, wherein said radiation-sensitive compound comprises more than one halogen atom attached to one carbon atom or to one aromatic ring.

* * * * *